Dec. 8, 1953

W. W. BOELENS 2,662,170

RADIO RECEIVING CIRCUIT WITH AUTOMATIC VOLUME CONTROL AND NOISE SUPPRESSING MEANS

Filed July 26, 1949

INVENTOR.
WILLEM WIGGER BOELENS.
BY

AGENT.

Patented Dec. 8, 1953

2,662,170

UNITED STATES PATENT OFFICE 2,662,170

RADIO RECEIVING CIRCUIT WITH AUTOMATIC VOLUME CONTROL AND NOISE SUPPRESSING MEANS

Willem Wigger Boelens, Eindhoven, Netherlands, assignor to Hartford National Bank and Trust Company, Hartford, Conn., as trustee Application July 26, 1949, Serial No. 106,802

Claims priority, application Netherlands August 17, 1948

2 Claims. (Cl. 250—20)

Figure 1:
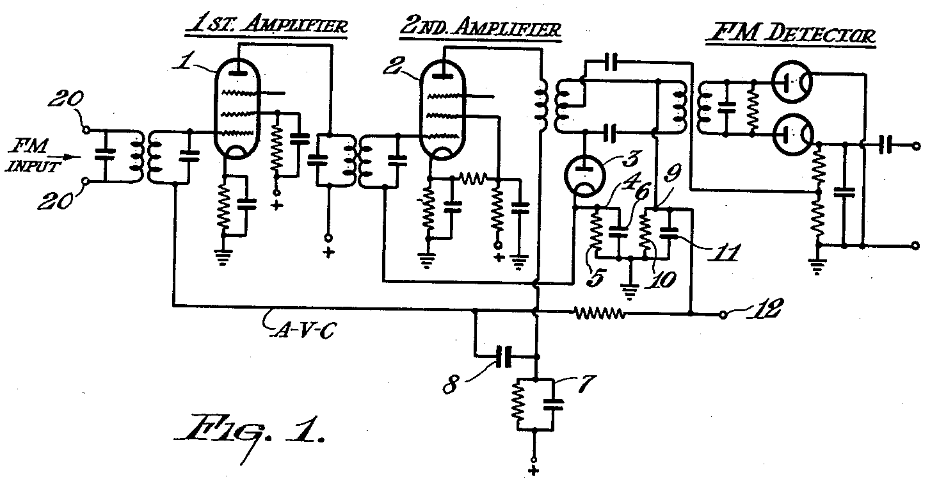

This invention relates to radio-receiving circuit arrangements, more particularly for frequency-modulated oscillations, comprising automatic volume control and means for suppressing undue amplitude modulation of the incoming oscillations.

In a known circuit-arrangement for receiving frequency-modulated oscillations means are provided for suppressing undue amplitude modulation by which the oscillations produced in the output circuit of the arrangement are detected by an amplitude detector. The output of the detector thus provides an auxiliary oscillation corresponding to the undue amplitude modulation and this is applied, as a modulating oscillation, to at least one of the tube stages preceding the amplitude detector in the receiving channel.

In the prior patent specification No. 793,495, now Patent No. 2,617,021, issued November 4, 1952 is described an improvement in this circuit-arrangement, in which the auxiliary oscillation is amplified in reflex by one of the tube stages provided in the receiving channel. The auxiliary oscillation is preferably amplified with the use of an alternating-voltage reflex amplifier, which can be built at much lower cost than a direct-voltage amplifier.

The present invention relates more particularly to such circuit-arrangements in which the alternating-voltage component of the said auxiliary oscillation is amplified, preferably in reflex. In such an arrangement the difficulty is encountered that one control using the auxiliary oscillation for suppressing undue amplitude modulation, is required and also a separate automatic volume control for the input signal is required which, in the case of great differences in the input signal prevents the amplifying tubes for the auxiliary oscillation from exhibiting excessive difference in adjustment. Thus, one amplitude detector is required, in the output of which a control-voltage for the automatic volume control is produced and a second amplitude detector is required by which the said auxiliary oscillation for suppressing undue amplitude modulation is produced. The present invention provides a solution of the problem of producing the two said oscillations with the use of the same amplitude detector.

According to the invention, the output circuits of the amplitude detector comprise two output filters, one having a comparatively small resistance and a time-constant which is small for the audio-frequency to be received, this filter having produced across it the auxiliary oscillation, and the other having a resistance at least three times higher and a time-constant which is great for the lowest audio-frequency to be transmitted, this filter having produced across it the automatic gain control-voltage, whilst the auxiliary oscillation is pre-amplified, preferably in reflex, in one of the tubes preceding the amplitude detector, to such an extent that the oscillation fed to the amplitude detector has small undue amplitude modulation, for example, a modulation depth of 10% at the most.

Figure 2:
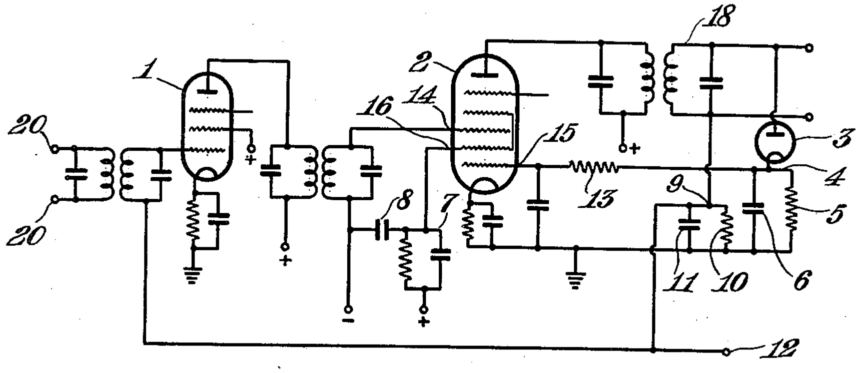

In order that the invention may be clearly understood and readily carried into effect, a number of embodiments will now be described by way of example with reference to the accompanying drawing, of which:

Fig. 1 shows a circuit-arrangement according to the invention comprising two amplifying tubes, with the use of which the incoming oscillations are amplified, the auxiliary oscillation being amplified in reflex in one tube, after which the amplified auxiliary oscillation controls the amplification of the other tube and Fig. 2 shows a circuit-arrangement comprising an amplifying device for the incoming oscillations, having two control-electrodes in which the auxiliary oscillation is first amplified and then caused to modulate the incoming oscillation.

In Fig. 1, tubes 1 and 2 represent two amplifying tubes for amplifying the oscillations, for example, frequency-modulated oscillations supplied to input terminals 20. In the output of tube 2 oscillations are produced which would exhibit undue amplitude modulation in the absence of the means to be mentioned hereinafter. This amplitude modulation is detected with the use of an amplitude detector 3, the output of which includes an output filter 4, comprising a comparatively small resistance 5 and a condenser 6, across which an auxiliary oscillation is thus produced corresponding to the undue amplitude modulation of the output oscillations of tube 2. This auxiliary oscillation is supplied to the input of tube 2 and amplified in reflex by this tube, after which the amplified auxiliary oscillation produced across a filter 7 controls the gain factor, more particularly the mutual conductance of tube 1. Since, with the use of tube 2, low-frequency alternating voltages only are amplified, the reception of various transmitters, in which the amplitude of the incoming oscillations fed to the terminals 20 may differ appreciably, for example, by a factor 100, will not effect the control of the mutual conductance of tube 1. There is consequently the difficulty that, in the case of great amplitude differences of the input oscillations, the adjustment of tubes 1 and 2 and thus the control sensitiveness and the control stability vary to a considerable extent with this amplitude. This could be avoided if tube 2 were of the direct-voltage amplifier type, which, however, is costly and complicated. It is simpler to include a separate gain control in the arrangement, which ensures that the amplitude of the incoming oscillations differs to a slight extent only when different transmitters are received.

This automatic gain control voltage is produced with the use of the same amplitude detector 3, with which the auxiliary oscillation for suppressing undue amplitude modulation is produced. For this purpose the output circuit of the amplitude detector 3 comprises a second filter 9, having a resistance 10, which is at least three times, for example five to ten times, greater than resistance 5, and a condenser 11, which has a value such that the time-constant of the filter exceeds the value corresponding to the lowest audio-frequency to be transmitted. With the use of the automatic gain control-voltage produced across the filter 9, the amplification of at least one of the tubes preceding the detector, for example, tube 1 is controlled. Since resistance 10 is chosen to be so much greater than resistance 5, a sensitive automatic gain control is ensured. This is made possible in that the audio-frequency auxiliary oscillation produced across resistance 5, owing to the said automatic suppression of undue amplitude modulation, has a modulation depth which as a rule, is very small, for example of the order of 1%, and which may be, for example, 10% at the most.

The said receiving circuit-arrangement permits of obtaining automatic silent tuning in a simple manner by connecting the filter 4 to the grid of tube 2 and by including in a grid circuit a source of comparatively high negative grid-bias. If in this circuit-arrangement no input signal appears, the output circuit of the amplitude detector 3 will have produced across it a small alternating voltage or no alternating voltage at all, so that the direct-voltage component of the voltage produced across filter 4 is so small that tube 2 is operated in that position of its characteristic curve in which the mutual conductance is very low. If, however, the amplitude of the incoming oscillation fed to the terminals 20 increases, the amplitude of the oscillation produced across the output of tube 2 will also increase, so that the direct-voltage component of the voltage produced across filter 4 ensures an adjustment of tube 2 in that position of its characteristic curve in which the mutual conductance has a sufficiently high value which is substantially constant. The control described is slightly counteracted in that the voltage across filter 9 also varies, so that tube 1 is adjusted in the range of higher mutual conductance when the input signal decreases. Suitable proportioning may, however, ensure that for those incoming amplitudes for which the arrangement is not required to be sensitive (silent tuning), the mutual conductance of tube 1 no longer increases when the control-voltage increases.

As an alternative, with the use of a biassed diode arranged, for example, between a terminal 12 and earth, it may be ensured that the automatic gain control does not set in before a predetermined minimum incoming signal is received (delayed automatic volume control).

Furthermore, the voltage produced across filter 9 may be supplied through terminal 12 to a tuning indicator, for example a "tuning-eye."

In the circuit-arrangement shown in Fig. 2, in which the same reference numerals are used as in Fig. 1, the oscillation supplied to the input terminals 20 is amplified with the use of a tube 2 comprising two control-grids 14 and 15. The oscillation produced across the output of tube 2, is supplied to the amplitude detector 3 having a first output filter 4, across which the said auxiliary oscillation is produced, and a second output filter 9, across which the voltage for the automatic volume control of the receiver is produced and which, for example, controls the gain factor of the amplifying tube 1, preceding the tube 2.

The auxiliary oscillation produced across filter 4 is supplied, for example, to the first control-grid 15 of the discharge tube 2, the circuit of the first screen-grid 16 of discharge tube 2 comprising a low frequency impedance, across which an oscillation amplified in reflex having the frequency of the auxiliary oscillation is produced. This amplified auxiliary oscillation is supplied, across a condenser 8 allowing the passage of this frequency, to the control-grid 14 of the electric discharge tube 2. Thus the output circuit of tube 2 has produced across it a modulated oscillation which is substantially free from amplitude modulation, since, owing to the amplified auxiliary voltage, a very deep counter-modulation of the input oscillation supplied to the grid 14 and exhibiting the undue amplitude modulating is ensured.

Various modifications of the circuit-arrangement shown in Fig. 2 are possible. Thus, for example, the auxiliary oscillation may be supplied to the grid 15 and the amplified auxiliary oscillation may be taken from the anode circuit of tube 2 and supplied to control-grid 14. Alternatively, the auxiliary oscillation may be supplied to control-grid 14 and the amplified auxiliary oscillation may be taken from the screen-grid 16 or from the anode circuit of the discharge tube 2, the amplified auxiliary oscillation being supplied to control-grid 1. Furthermore, the input oscillation may be made operative in the circuit of control-grid 15, instead of being operative in that of control-grid 14.

An advantage of the circuit-arrangement shown in Fig. 2 as compared with that of Fig. 1 consists in that the amplification of the auxiliary voltage is here effected in the same tube as that in which the counter-modulation of the incoming oscillations takes place, so that one amplifying tube can be saved. In this case the automatic volume control-voltage, in contradistinction to the auxiliary oscillation, may readily be applied, if desired, to a stage preceding the amplitude detector 3 by more than two stages, for example to a high-frequency amplifier of the receiving arrangement preceding the mixing stage.

What I claim is:

1. A radio receiver for a frequency-modulated wave having unwanted amplitude modulation components comprising first and second amplifier stages coupled in cascade relation, means to feed said wave through said stages to effect amplification thereof, an amplitude detection circuit coupled to the output of said second stage and including a diode having an anode and a cathode, a first resistance-capacitance network connected between said cathode and a point of constant potential and a second resistance-capacitance network connected between said anode and said point, said first network having a time constant at which a positive-going first potential is developed thereacross with respect to said point depending on relatively rapid amplitude variations in said wave, said second network having a time constant at which a negative-going second potential is developed thereacross with respect to said point depending on relatively slow amplitude variations in said wave, means to apply said first potential to said second stage to effect reflex amplification and phase reversal thereof to produce a control voltage in the output of said second stage, means to apply said control voltage to one of said stages to effect automatic volume control thereof, and means to apply said second potential to said first stage to effect automatic volume control thereof.

2. A radio receiver, as set forth in claim 1, wherein said second stage includes an electron discharge tube having a cathode, two control grids, a screen grid and an anode, and circuits therefor, said wave being applied to said one of said control grids, said detection circuit being coupled to said anode, said first potential being applied to said other control grid, said control voltage being derived from said screen grid and being applied to said one control grid to effect automatic volume control of said stage.

WILLEM WIGGER BOELENS.

References Cited in the file of this patent

UNITED STATES PATENTS

| Number | Name | Date |
|---|---|---|
| 1,978,182 | Wilhelm | Oct. 23, 1934 |
| 2,214,608 | Bull | Sept. 10, 1940 |
| 2,253,338 | Lewis | Aug. 19, 1941 |
| 2,259,520 | Freeman | Oct. 21, 1941 |
| 2,316,851 | Foster | Apr. 20, 1943 |
| 2,363,649 | Crosby | Nov. 28, 1944 |
| 2,395,770 | Vilkomerson | Feb. 26, 1946 |
| 2,427,691 | Pritchard | Sept. 23, 1947 |
| 2,472,301 | Koch | June 7, 1949 |
| 2,477,391 | Reid et al. | July 26, 1949 |
| 2,498,839 | Hayward | Feb. 28, 1950 |